United States Patent
Ahmad et al.

(10) Patent No.: US 8,937,496 B1
(45) Date of Patent: Jan. 20, 2015

(54) CLOCK MONITOR

(71) Applicant: Xilinx, Inc., San Jose, CA (US)

(72) Inventors: Sagheer Ahmad, Cupertino, CA (US); Alex S. Warshofsky, Miami Beach, FL (US); Ygal Arbel, Morgan Hill, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/464,661

(22) Filed: Aug. 20, 2014

(51) Int. Cl.
*G01R 23/02* (2006.01)
*H03D 3/00* (2006.01)
*H03K 9/06* (2006.01)
*H03K 5/19* (2006.01)

(52) U.S. Cl.
CPC ........................... *H03K 5/19* (2013.01)
USPC ............................ 327/39; 327/551

(58) Field of Classification Search
USPC .................................... 327/34, 551
See application file for complete search history.

(56) References Cited

U.S. PATENT DOCUMENTS

| | | | | |
|---|---|---|---|---|
| 6,008,672 | A * | 12/1999 | Suto ................................. | 327/34 |
| 7,592,775 | B2 * | 9/2009 | Altemose et al. ............. | 320/128 |
| 7,630,458 | B2 * | 12/2009 | Norman et al. ............... | 375/316 |
| 7,786,701 | B2 * | 8/2010 | Altemose ....................... | 320/136 |
| 2014/0232434 | A1 * | 8/2014 | Koazechi et al. ............... | 327/40 |
| 2014/0282502 | A1 * | 9/2014 | Natu et al. ........................ | 718/1 |

* cited by examiner

*Primary Examiner* — Adam Houston
(74) *Attorney, Agent, or Firm* — LeRoy D. Maunu

(57) ABSTRACT

A clock monitoring circuit is disclosed. The clock monitoring circuit is configured to receive first and second clock signals generated in respective clock domains. The clock monitoring circuit includes a first counter configured to count clock cycles of the first clock signal for a first period of time delineated by clock cycles of the second clock signal. The first counter outputs a count value indicating the number of counted clock cycles. The clock monitoring circuit also includes a threshold comparator circuit configured to generate an error signal in response to expiration of the first period of time and the first count value output by the first counter falling outside of an expected range.

20 Claims, 7 Drawing Sheets

US 8,937,496 B1

CLOCK MONITOR

FIELD OF THE INVENTION

The disclosure generally relates to monitoring of clock signals.

BACKGROUND

Programmable integrated circuits (ICs) are devices that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include an embedded processor that is capable of executing program code. The processor can be fabricated as part of the same die that includes the programmable logic circuitry and the programmable interconnect circuitry, also referred to collectively as the "programmable circuitry" of the IC. It should be appreciated that execution of program code within a processor is distinguishable from "programming" or "configuring" the programmable circuitry that may be available on an IC. The act of programming or configuring the programmable circuitry of an IC results in the implementation of different physical circuitry as specified by the configuration data within the programmable circuitry.

SUMMARY

A clock monitoring circuit is disclosed. The clock monitoring circuit is configured to receive first and second clock signals generated in respective clock domains. The clock monitoring circuit includes a first counter configured to count clock cycles of the first clock signal for a first period of time delineated by clock cycles of the second clock signal. The first counter outputs a count value indicating the number of counted clock cycles. The clock monitoring circuit also includes a threshold comparator circuit configured to generate an error signal in response to expiration of the first period of time and the first count value output by the first counter falling outside of an expected range.

A method is also disclosed for monitoring a first clock signal. Clock cycles of the first clock signal are counted for a first period of time delineated by clock cycles of a second clock signal. The first and second clock signals are derived from different clock sources. In response to the counted number of clock cycles falling outside of an expected range, defined by an upper threshold number and a lower threshold number, an error signal is generated.

A second method is also disclosed for monitoring a first clock signal. A first number of clock cycles is selected. One or more errors in the first clock are simulated. The first clock is monitored for errors by counting clock cycles of the first clock signal for a period of time defined by the first number of clock cycles in a second clock signal. The first and second clock signals are derived from different clock sources. A range of clock cycles expected to be observed in the first clock signal within the period of time is determined. In response to the counted number of clock cycles falling outside of the range, an error signal is generated.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION OF THE DRAWINGS

Figure 1:
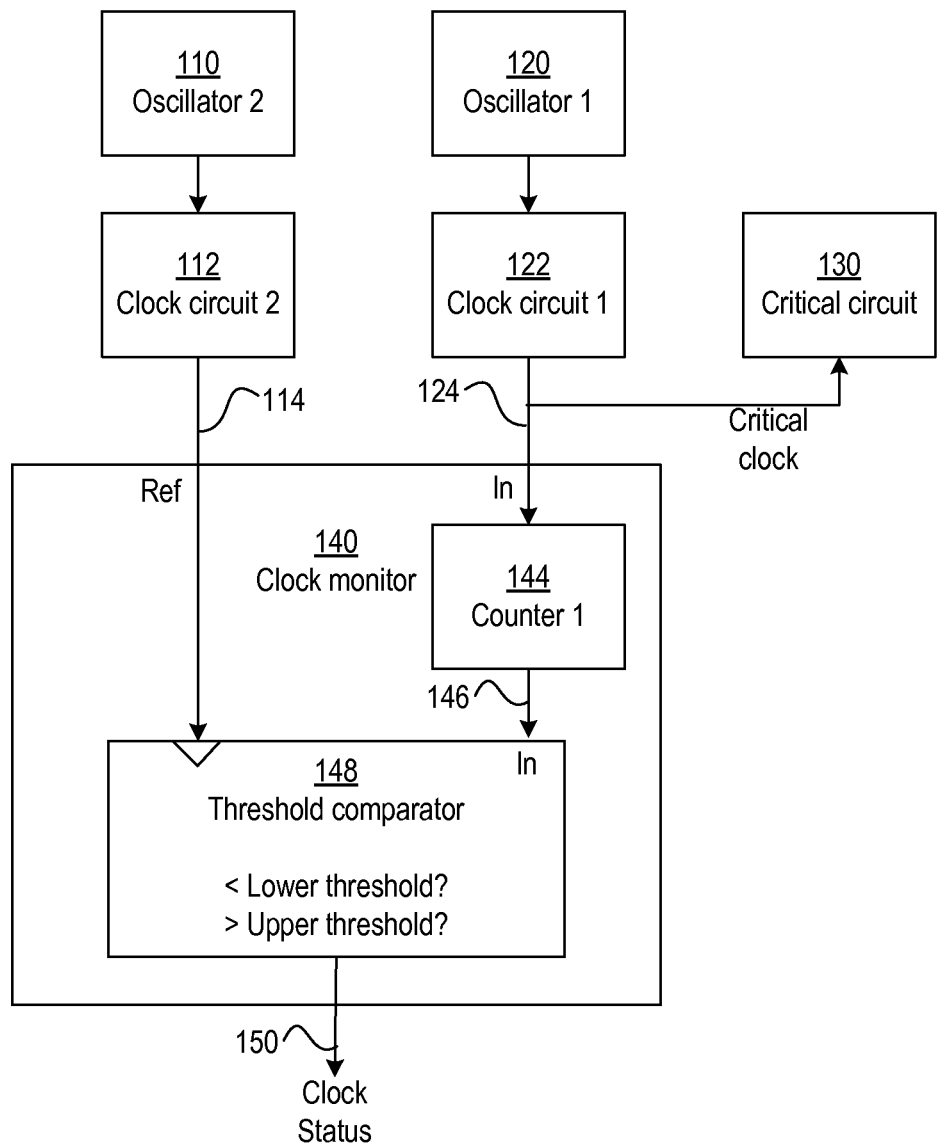
FIG. 1 shows an apparatus including a clock and clock monitor, in accordance with one or more implementations.

Clock signals are used in a number of applications to coordinate operations of various circuits of a system. Clock signals may be generated by various circuits such as phase locked loops (PLL) and/or clock managers. Clock signals are not perfectly stable but rather tend to drift over time due to power fluctuation and/or operating temperature of clock sources, for example. For mission critical and fail-safe applications, clock signals used to drive critical circuits, such as safety or error monitoring circuits, may be monitored to ensure that the clock signals remain active and remain within a specified frequency range. Some approaches monitor a critical clock generated by a clocking circuit (e.g., PLL or clock manager) by comparing the critical clock to a reference clock that is used by the clocking circuit to generate the critical clock. Such an approach can detect errors in the critical clock caused by a fault in the clocking circuit. However, if the critical clock is in error due to errors in the reference clock, the critical clock may appear to be operating correctly based on the comparison to the reference clock. An independently generated reference clock may be used to detect errors in a critical clock signal generated from a faulty reference. However, an independently generated reference clock will be asynchronous to the critical clock, making comparison of these clocks difficult. For ease of reference an independently generated clock may be referred to as an asynchronous clock.

Circuits and methods are disclosed for monitoring a critical clock signal by using an independently generated reference clock. Rather than directly comparing the critical clock signal to the reference clock, errors are detected by counting clock cycles of the critical clock signal for a period of time. The period of time is determined based on the independently generated reference. Clock cycles may be counted by counting either rising or falling edges in the critical clock signal. As explained in more detail with reference to the figures, the number of rising or falling edges exhibited by the critical clock signal within a period of time may differ depending on the phase alignment of the critical clock cycle and the independently generated reference clock. The monitored clock may be determined to be in error if the number of counted clock cycles falls outside of a range of clock cycles expected to be exhibited by the monitored clock within the specified period of time.

In some implementations, a clock monitoring circuit includes a first counter configured to count clock cycles of a first clock signal for a period of time defined by a second clock and output a first count value indicating the number of counted clock cycles. A threshold comparator circuit generates the error signal in response to expiration of the period of time and the first count value output by the first counter falling outside of an expected range.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same items or multiple instances of the same item.

Turning now to the figures, FIG. 1 shows an apparatus including a clock and clock monitor, in accordance with one or more implementations. The apparatus includes a first clock circuit 122 (e.g., a phase locked loop, clock divider, or clock manager) configured to produce a critical clock 124 from a first clock source 120 (e.g., an oscillator). The critical clock 124 may be used by a critical circuit 130 of the apparatus. The critical clock 124 is monitored by a clock monitor circuit 140 for errors. The clock monitor circuit 140 includes a counter 144 configured to count clock cycles of the critical clock signal for a period of time defined by a second clock and output a count value 146 indicating the number of counted clock cycles. A threshold comparator 148 examines the count value 146 output by the counter 144 after a period of time defined by a reference clock 114. In response to the period of time expiring, the threshold comparator 148 determines whether or not the count value 146 output by the counter 144 falls outside of an expected range. The expected range is defined by a lower threshold value and an upper threshold value. The lower threshold value indicates the lowest number of clock cycles that the critical clock cycle may exhibit within the period of time when operating correctly. The upper threshold value indicates the greatest number of clock cycles that the critical clock cycle may exhibit within the period of time when operating correctly.

In response to the count value 146 falling outside of the expected range, the threshold comparator 148 outputs a clock status signal 150 having a first value (e.g., logic 1) indicative of an error. Otherwise, the threshold comparator 148 outputs the clock status signal 150 having a second value (e.g., logic 0) indicative of correct operation of the critical clock.

In this example, the reference clock 114 is provided by clock circuit 112. The clock circuit 112 generates the second clock from a second clock source 110 that is different from the clock source 120 used to generate the critical clock. Because the critical clock and the reference clock are generated from different clock sources, errors in the clock source 120 that cause errors in the critical clock 124 are not likely to affect the reference clock 114. Using the reference clock, the clock monitor circuit can detect errors in the critical clock that are caused by an error in the clock source 120. As the clock monitor circuit is not susceptible to errors in the clock source 120, it may be used to improve reliability and fault tolerance in a number of applications.

The clock monitor may be adapted to use reference clocks generated from various sources. In some implementations, the reference clock 114 may be generated by on-die ring-oscillator. In some other implementations, the reference clock 114 may be generated by an external clock circuit and input to the apparatus. The adaptability of the clock monitor to use various clocks as the reference clock may be particularly useful for systems, such as programmable ICs, which may be used in a wide variety of applications.

Figure 2:
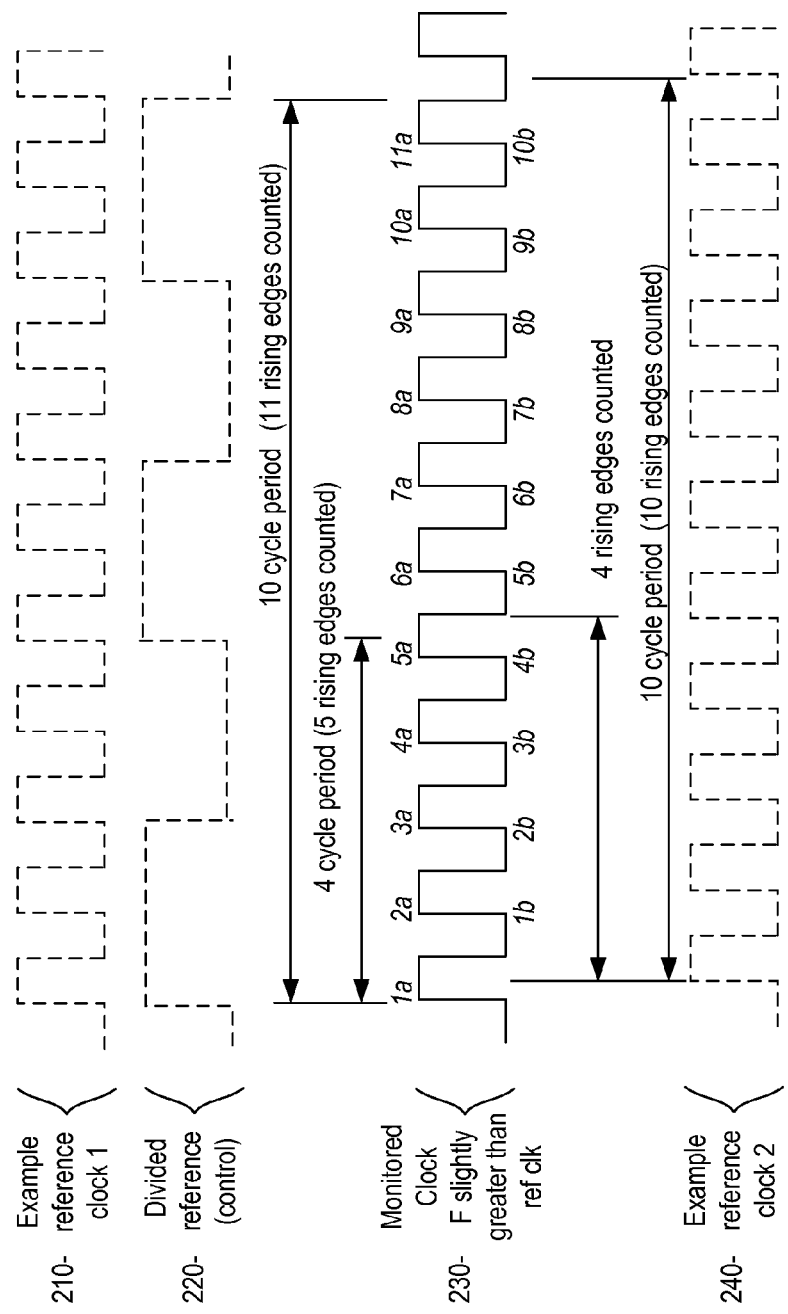
FIG. 2 illustrates counting of clock cycles of a monitored clock using a reference clock.

Various implementations monitor a clock signal for errors by counting the number of clock cycles that occur in the clock signal in a certain period of time indicated by a reference clock. FIG. 2 illustrates counting clock cycles of a monitored clock using a reference clock. The examples show a first reference clock in waveform 210, a monitored clock in waveform 230, and a second reference clock in waveform 240. The second reference clock is a phased-shifted version of the first reference clock. As shown in FIG. 2, the number of clock cycles that occur in a time period of a reference clock may differ depending on the phase alignment of the monitored clock with the reference clock. As a first example implementation, clock cycles of the critical clock are counted for 4 cycles of the reference clocks. Using the top-most reference clock shown in waveform 210, 5 rising edges (1a, 2a, 3a, 4a, and 5a) are counted in the 4 cycle period. Using the bottom-most reference clock, 4 rising edges (1b, 2b, 3b, and 4b) are counted in the 4 cycle period. As a second example implementation, clock cycles of the critical clock are counted for 10 cycles of the reference clocks. Using the reference clock in waveform 210, 11 rising edges (1a-11a) are counted in the 10 cycle period. Using the reference clock in waveform 240, 10 rising edges (1b-10b) are counted in the 10 cycle period.

In some implementations, a control clock signal may be generated that has a clock cycle that defines the time period that clock cycles are to be counted. Waveform 220 shows an example control clock that has one clock cycle for every four clock cycles of the reference clock. The waveform 220 may be generated, for example, using a programmable clock divider set to divide by four. Such a programmable clock divider may be used to set the number of clock cycles of the reference that the critical clock should be counted.

Errors in frequency of the monitored clock may be detected within a margin of error of one clock cycle in the period of time in which clock cycles are counted. In the 4-cycle period example, the resulting margin of error is 25% (1 cycle error/4-cycle period). The margin of error can be reduced by increasing the period of time in which clock cycles are counted. For instance, in the 10-cycle period example, the resulting margin of error is 10% (1 cycle error/10-cycle period).

The margin of error required for error detection may vary for different applications. In some applications, a coarse error monitoring (having a higher margin of error) may be desired to quickly detect and respond to large errors in the monitored clock. In some other applications, where slower response time can be tolerated, a finer error monitoring (having a lower margin of error) may be desired to detect smaller errors in the monitored clock.

Figure 3:
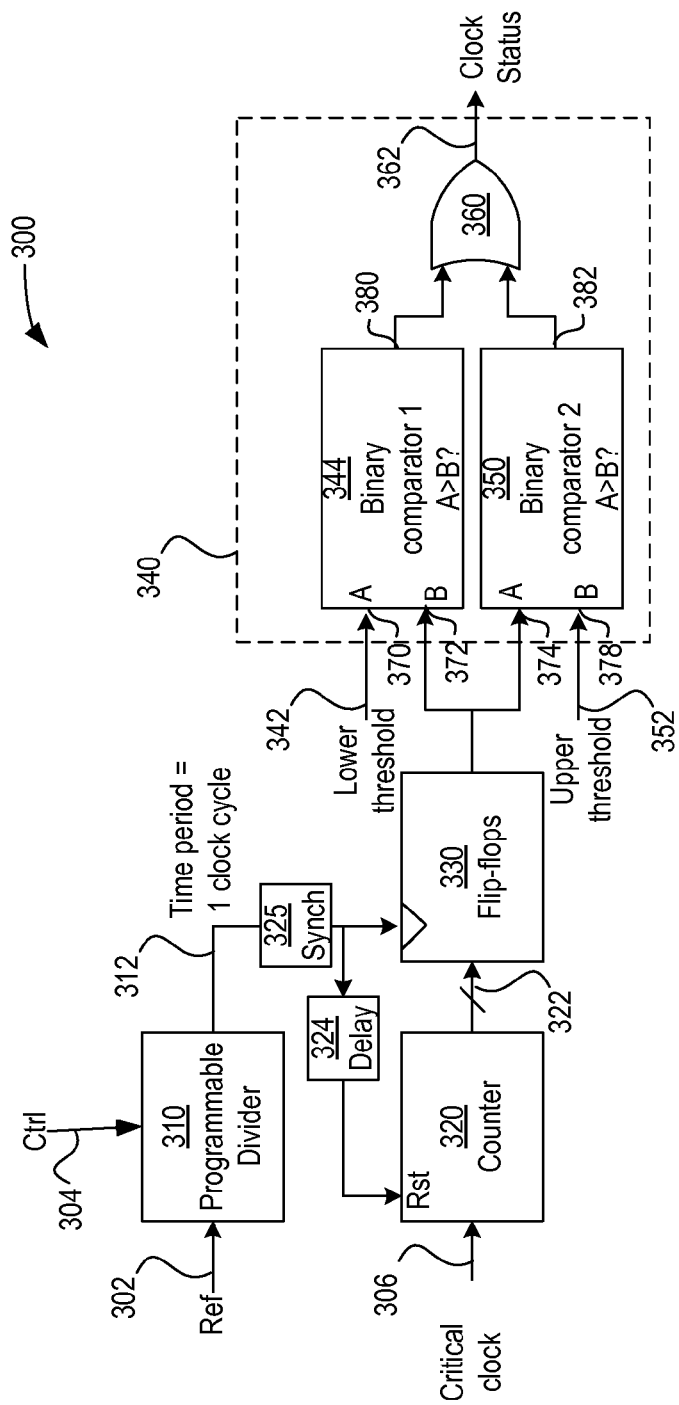
FIG. 3 shows an example clock monitor, in accordance with one or more implementations.

FIG. 3 shows an example clock monitor circuit, in accordance with one or more implementations. The clock monitor 300 includes a counter 320 configured to count clock cycles of an input critical clock signal 306 and output a count value 322 indicating the number of clock cycles counted by the counter 320. The clock monitor 300 includes a programmable clock divider 310 configured to divide a reference clock 302 by a number (N) indicated by control signal 304 to produce a control clock 312. The control clock 312 has one clock cycle for every N clock cycles of the reference clock 302. The clock monitor 300 includes a set of flip-flops 330 configured to sample the count value 322 output by the counter 320 after a period of time equal to 1 clock cycle of the control clock 312. For example, the set of flip-flops 330 may be configured to sample a new value of the count value 322 at a rising edge of the control clock 312. In some implementations, the clock monitor 300 may include a synchronizer circuit 325 configured to synchronize the control clock 312 to the clock domain of the critical clock 306.

The counter 320 is reset after the count value is sampled by the flip-flops 330. For instance, the counter may be reset by a rising edge of a slightly delayed version of the control clock 312 provided by delay 324.

The count value sampled by the flip-flops 330 is analyzed by a threshold comparator circuit 340 to determine if the critical clock 306 is operating in error. In response to the count value falling outside of an expected range between a lower threshold and an upper threshold, the threshold comparator circuit 340 outputs a clock status signal 362 having a first value (e.g., logic 1) indicative of an error. Otherwise, the threshold comparator circuit 340 outputs the clock status signal 362 having a second value (e.g., logic 0) indicative of correct operation of the critical clock.

In this example, the threshold comparator circuit 340 includes first and second binary comparator circuits 344 and 350 configured to compare the count value to lower and upper threshold values. The binary comparator 344 outputs a logic 1 if the count value received at input port 372 is less than the lower threshold value 342 received at input port 370. Otherwise, binary comparator 344 outputs a logic 0. The binary comparator 350 outputs a logic 1 if the count value received at input port 374 is greater than the upper threshold value 352 received at input port 378. Otherwise, the binary comparator 350 outputs a logic 0. In this configuration, if either of the binary comparator circuits 344 and 350 outputs a logic 1, the count value is outside of the expected range. In this example, the threshold comparator circuit 340 includes a logical gate 360, which performs a logical OR of signals, output by an output port 380 of the binary comparator 344 and output by output port 382 of the binary comparator 350, to produce the clock status signal 362.

Figure 4:
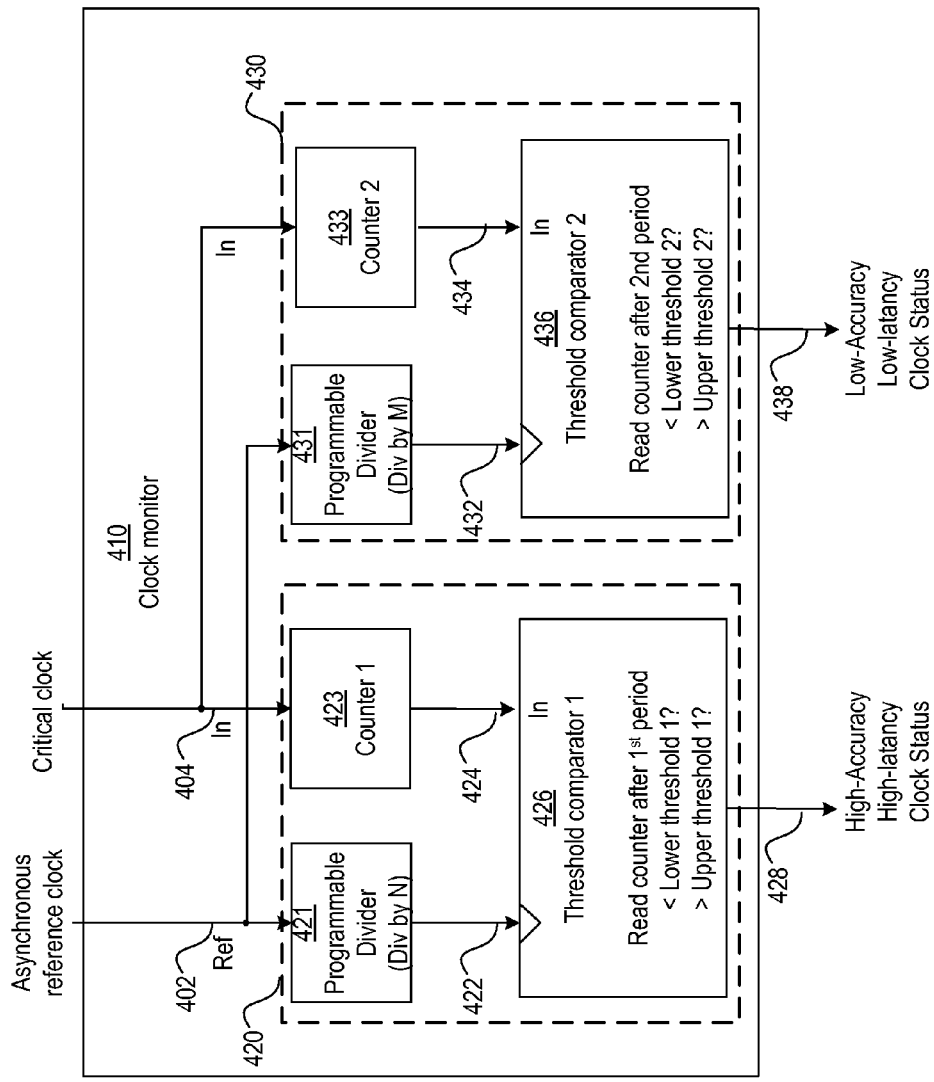
FIG. 4 shows a clock monitor configured to monitor a clock signal with multiple tolerances, in accordance with one or more implementations.

In some implementations, a clock monitor circuit may be configured to perform both fine and coarse error monitoring of a clock signal. FIG. 4 shows a clock monitor configured to monitor a critical clock signal 404 with multiple tolerances, in accordance with one or more implementations. The clock monitor 410 includes a first circuit 420 configured to monitor the critical clock 404 with a lower margin of error to produce a higher-accuracy higher-latency clock status signal 428. The clock monitor 410 also includes a second circuit 430 configured to monitor the critical clock 404 with a higher margin of error to produce a lower-accuracy lower-latency clock status signal 438. Similar to clock monitor 140 discussed with reference to FIG. 1, each of the circuits 420 and 430 includes a respective counter 423 or 433 and a respective threshold comparator 426 or 436.

Each of the counter 423 and 433 is configured to count clock cycles of the critical clock 404. Threshold comparator 426 is configured to sample a count value 424 output by the counter 423 after a first period of time defined by a first number (N) of clock cycles of the asynchronous reference clock 402. In this example, the first circuit 420 includes a programmable divider 421 configured to divide the reference clock 402 by the first number N to produce a first control clock 422. The first control clock 422 has one clock cycle for every N clock cycles of the reference clock 402 and may be used to indicate when the first period of time has expired. The threshold comparator 426 sets the higher-accuracy higher-latency clock status signal 428 to a value indicative of an error if the count value 424 falls outside of a first range defined by upper threshold 1 and lower threshold 1.

Threshold comparator 436 is configured to sample a count value 434 output by the counter 433 after a second period of time defined by a second number of clock cycles (M) of the asynchronous reference clock 402. In this example, the second circuit 430 includes a programmable divider 431 configured to divide the reference clock 402 by the second number M to produce a second control clock 432. The second control clock 432 has one clock cycle for every M clock cycles of the reference clock 402 and may be used to indicate when the second period of time has expired. The second number of clock cycles M is less than the first number of clock cycles, causing the circuit 430 to be lower accuracy. The threshold comparator 436 sets the lower-accuracy lower-latency clock status signal 438 to a value indicative of an error if the count value 434 falls outside of a second range defined by upper threshold 2 and lower threshold 2.

Figure 5:
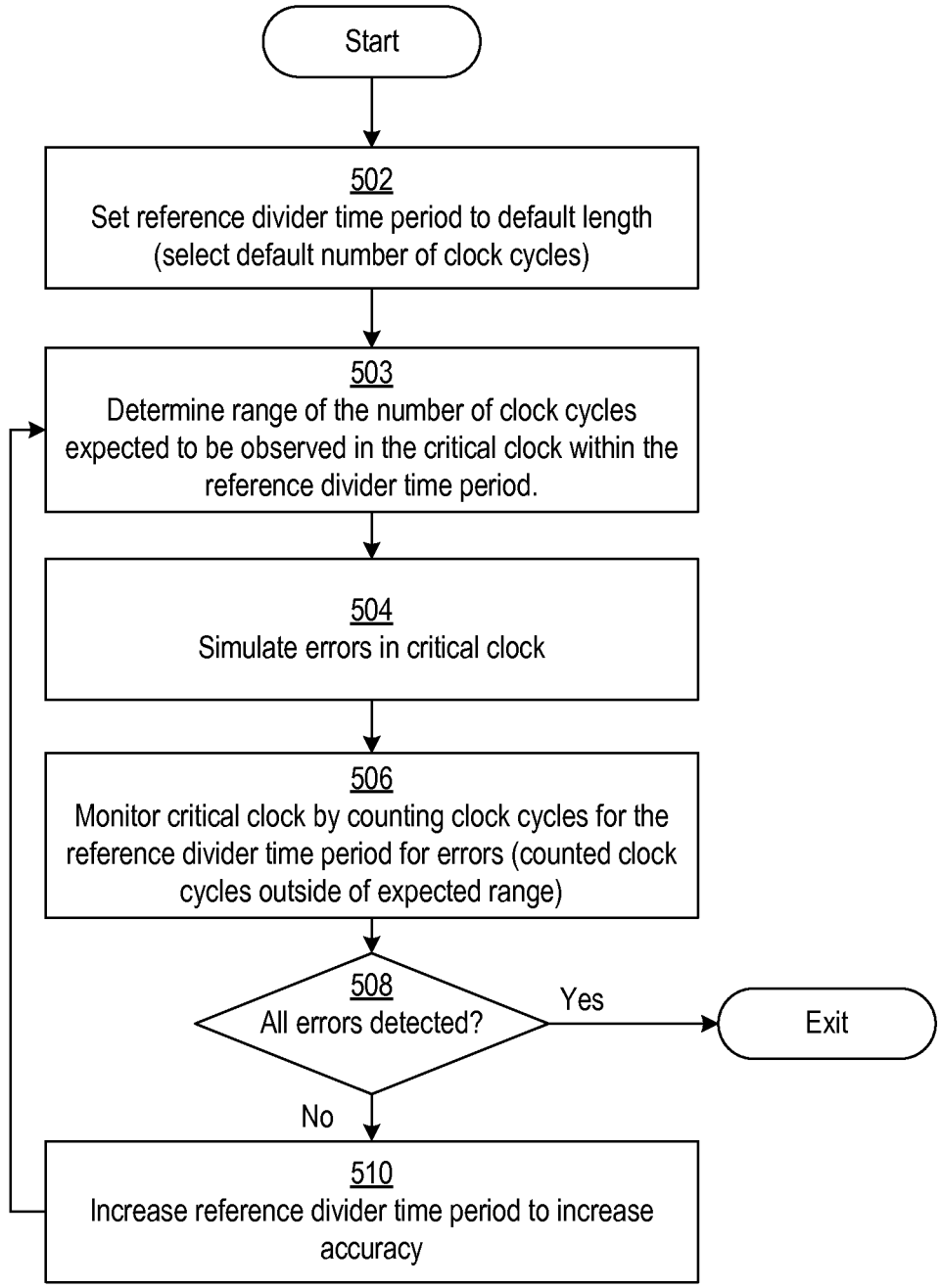
FIG. 5 shows a process for configuring accuracy of a clock monitor, in accordance with one or more implementations.

The accuracy required for monitoring a critical clock may vary for different applications. FIG. 5 shows a process for configuring accuracy of a clock monitor for a circuit. A reference divider time period is set to a default length, corresponding to a default accuracy, at block 502. At block 503, a range of the number of clock cycles expected to be observed in the critical clock within the reference divider time period is determined. Errors are simulated in the critical clock to be monitored at block 504. For example, errors may be simulated in the critical clock by adjusting phase or frequency of the critical clock or introducing jitter to the critical clock. At block 506, the critical clock is monitored by counting clock cycles of the critical clock for the reference divider time period, as discussed above. If all errors are detected by the monitoring, decision block 508 causes the process to exit. Otherwise, the reference divider time period is increased at block 510 to increase accuracy of the clock monitoring. The determining the expected range, the simulating, the monitoring, and the increasing of the test time period are repeated until the clock monitoring is accurate enough to detect all of the simulated errors.

Figure 6:
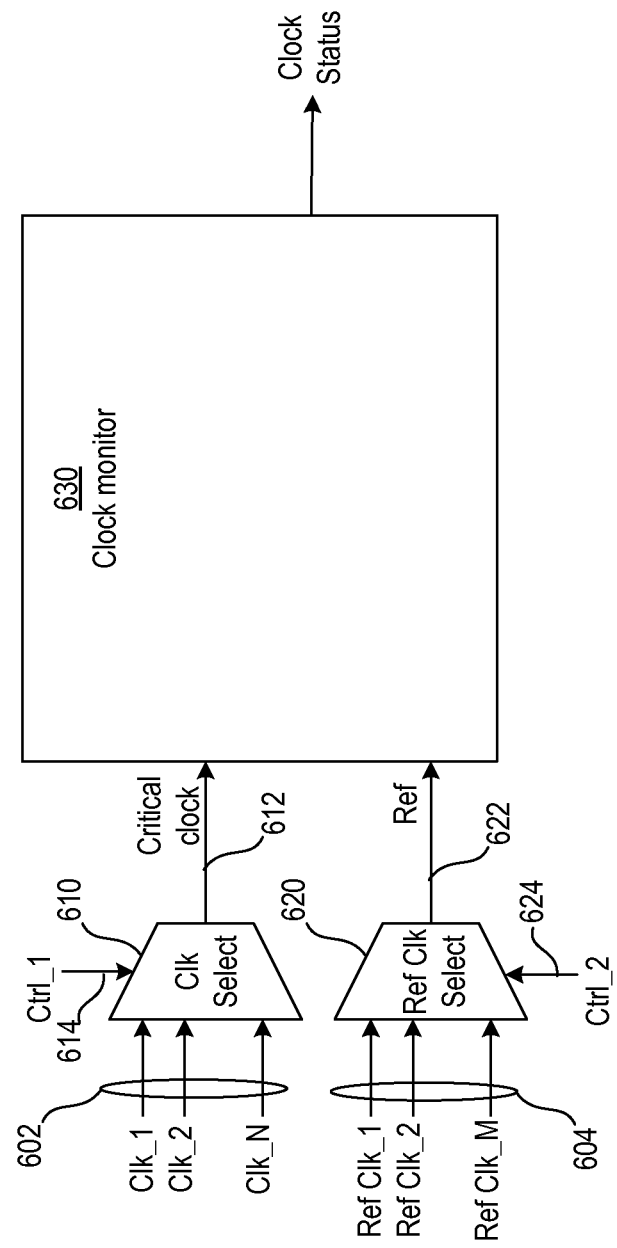
FIG. 6 shows an apparatus including a clock monitor and a selection circuit for selection of a plurality of clocks for monitoring, in accordance with one or more implementations.

In some applications, a monitoring circuit may be included in a user configurable circuit, such as a programmable IC, for monitoring clock signals selected by a user. FIG. 6 shows an apparatus including a clock monitor and a selection circuit for selection of a plurality of clocks for monitoring, in accordance with one or more implementations. The apparatus includes a clock monitor 630 configured to monitor a critical clock 612 using an asynchronous reference clock 622. The clock monitor 630 may be implemented, for example, using the clock monitor 140 shown in FIG. 1 or the clock monitor 300 shown in FIG. 3. In this example, the apparatus includes a multiplexer 610 configured to select one of a plurality of clocks 602 as the critical clock to be monitored. The selected one of the clocks 602 is specified by a first control signal 614. For instance, the control signal may be adjusted to specify a clock of a programmable IC that is used by a critical circuit of a user circuit design implemented by the programmable IC. In this example, the apparatus also includes a multiplexer 620 configured to select one of a plurality of reference clocks 604 as the asynchronous reference clock to be used by clock monitor 630. The selected one of the reference clocks 604 is specified by a second control signal 624.

Figure 7:
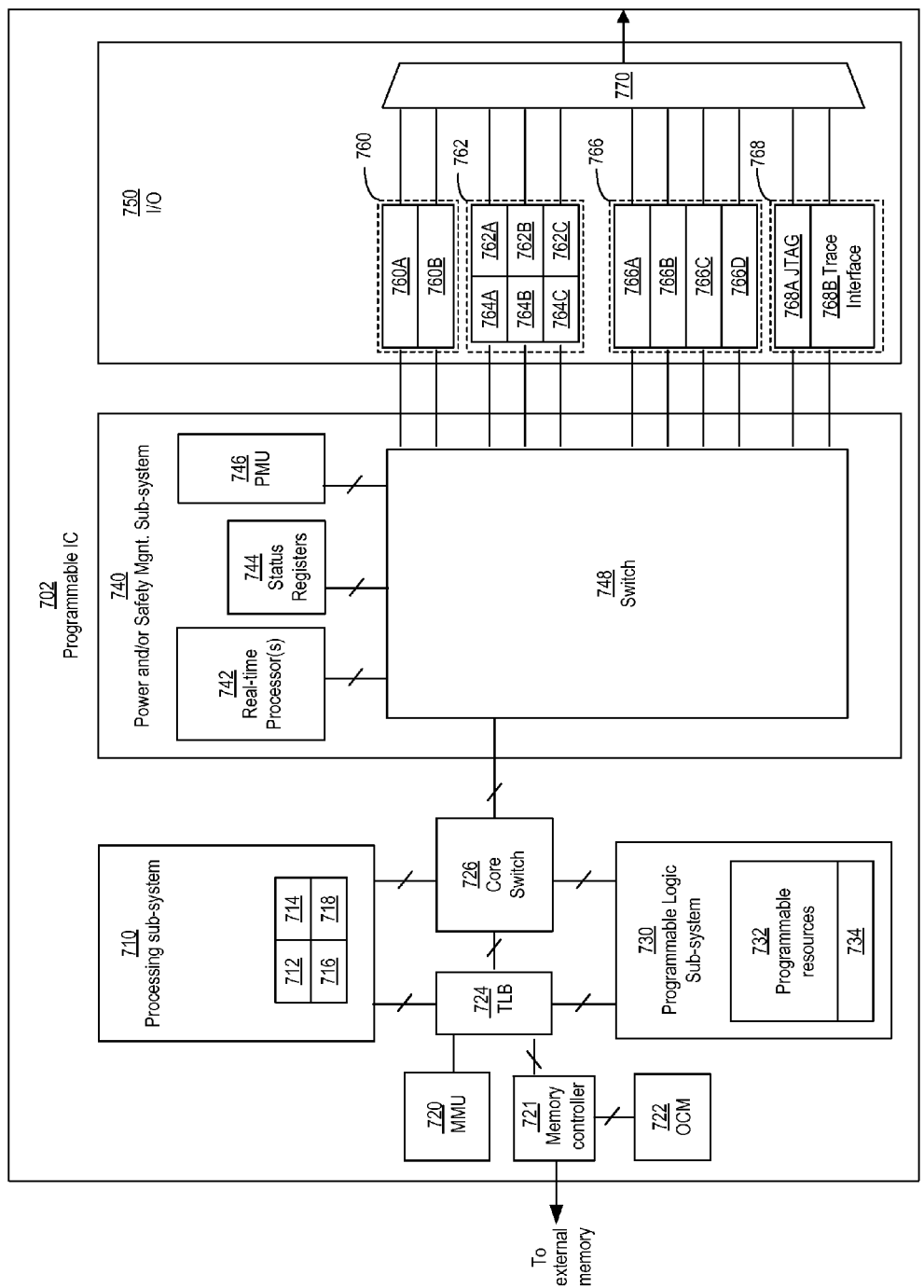
FIG. 7 shows a programmable IC that may be configured to include a clock monitor in accordance with one or more implementations.

FIG. 7 shows a programmable IC 702 that may be configured to include a clock monitor in accordance with one or more implementations. The programmable IC may also be referred to as a System On Chip (SOC), which includes a processing sub-system 710 and a programmable logic sub-system 730. The processing sub-system 710 may be programmed to implement a software portion of the user design, via execution of a user program. The program may be specified as part of a configuration data stream or may be retrieved from an on-chip or off-chip data storage device. The processing sub-system 710 may include various circuits 712, 714, 716, and 718 for executing one or more software programs. The circuits 712, 714, 716, and 718 may include, for example, one or more processor cores, floating point units (FPUs), an interrupt processing unit, on chip-memory, memory caches, and/or cache coherent interconnect.

The programmable logic sub-system 730 of the programmable IC 702 may be programmed to implement a hardware portion of a user design. For instance, the programmable logic sub-system may include a number of programmable resources 732, which may be programmed to implement a set of circuits specified in a configuration data stream. The programmable resources 732 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 732 may be programmed by loading a configuration data stream into the configuration memory cells, which define how the programmable interconnect circuits and programmable logic circuits are configured. The collective states of the individual memory cells then determine the function of the programmable resources 732. The configuration data can be read from memory (e.g., from an external PROM) or written into the programmable IC 702 by an external device. In some implementations, configuration data may be loaded into configuration memory cells by a configuration controller 734 included in the programmable logic sub-system 730. In some other implementations, the configuration data may be loaded into the configuration memory cells by a start-up process executed by the processing sub-system 710.

The programmable IC 702 may include various circuits to interconnect the processing sub-system 710 with circuitry implemented within the programmable logic sub-system 730. In this example, the programmable IC 702 includes a core switch 726 that can route data signals between various data ports of the processing sub-system 710 and the programmable logic sub-system 730. The core switch 726 may also route data signals between either of the programmable logic or processing sub-systems 710 and 730 and various other circuits of the programmable IC, such as an internal data bus. Alternatively or additionally, the processing sub-system 710 may include an interface to directly connect with the programmable logic sub-system—bypassing the core switch 726. Such an interface may be implemented, for example, using the AMBA AXI Protocol Specification (AXI) as published by ARM.

In some implementations, the processing sub-system 710 and the programmable logic sub-system 730 may also read or write to memory locations of an on-chip memory 722 or off-chip memory (not shown) via memory controller 721. The memory controller 721 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 721 is able to communicate is provided for purposes of illustration only and is not intended as a limitation or to be exhaustive. As shown in FIG. 7, the programmable IC 702 may include a memory management unit 720 and translation look-aside buffer 724 to translate virtual memory addresses used by the sub-systems 710 and 730 to physical memory addresses used by the memory controller 721 to access specific memory locations.

The programmable IC may include an input/output (I/O) sub-system 750 for communication of data with external circuits. The I/O sub-system 750 may include various types of I/O devices or interfaces including for example, flash memory type I/O devices, higher performance I/O devices, lower performance interfaces, debugging I/O devices, and/or RAM I/O devices.

The I/O sub-system 750 may include one or more flash memory interfaces 760 illustrated as 760A and 760B. For example, one or more of flash memory interfaces 760 can be implemented as a Quad-Serial Peripheral Interface (QSPI) configured for 4-bit communication. One or more of flash memory interfaces 760 can be implemented as a parallel 8-bit NOR/SRAM type of interface. One or more of flash memory interfaces 760 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 750 can include one or more interfaces 762 providing a higher level of performance than flash memory interfaces 760. Each of interfaces 762A-762C can be coupled to a DMA controller 764A-764C, respectively. For example, one or more of interfaces 762 can be implemented as a Universal Serial Bus (USB) type of interface. One or more of interfaces 762 can be implemented as a gigabit Ethernet type of interface. One or more of interfaces 762 can be implemented as a Secure Digital (SD) type of interface.

The I/O sub-system 750 may also include one or more interfaces 766 such as interfaces 766A-766D that provide a lower level of performance than interfaces 762. For example, one or more of interfaces 766 can be implemented as a General Purpose I/O (GPIO) type of interface. One or more of interfaces 766 can be implemented as a Universal Asynchronous Receiver/Transmitter (UART) type of interface. One or more of interfaces 766 can be implemented in the form of a Serial Peripheral Interface (SPI) bus type of interface. One or more of interfaces 766 can be implemented in the form of a Controller-Area-Network (CAN) type of interface and/or an I$^2$C type of interface. One or more of interfaces 766 also can be implemented in the form of a Triple Timer Counter (TTC) and/or a Watchdog Timer (WDT) type of interface.

The I/O sub-system 750 can include one or more debug interfaces 768 such as processor JTAG (PJTAG) interface 768A and a trace interface 768B. PJTAG interface 768A can provide an external debug interface for the programmable IC 702. Trace interface 768B can provide a port to receive debug, e.g., trace, information from the processing sub-system 710 or the programmable logic sub-system 730.

As shown, each of interfaces 760, 762, 766, and 768 can be coupled to a multiplexer 770. Multiplexer 770 provides a plurality of outputs that can be directly routed or coupled to external pins of the programmable IC 702, e.g., balls of the package within which the programmable IC 702 is disposed. For example, I/O pins of programmable IC 702 can be shared among interfaces 760, 762, 766, and 768. A user can configure multiplexer 770, via a configuration data stream to select which of interfaces 760-768 are to be used and, therefore, coupled to I/O pins of programmable IC 702 via multiplexer 770. The I/O sub-system 750, may also include a fabric multiplexer I/O (FMIO) interface (not shown) to connect interfaces 762-768 to programmable logic circuits of the programmable logic sub-system. Additionally or alternatively, the programmable logic sub-system 730 can be configured to implement one or more I/O circuits within programmable logic. In some implementations, the programmable IC 702 may also include a sub-system 740 having various circuits for power and/or safety management. For example, the sub-system 740 may include a power management unit 746 configured to monitor and maintain one or more voltage domains used to power the various sub-systems of the programmable IC 702. In some implementations, the power management unit 746 may disable power of individual sub-systems, when idle, to reduce power consumption, without disabling power to sub-systems in use.

The sub-system 740 may also include safety circuits to monitor the status of the sub-systems to ensure correct operation. For instance, the sub-system 740 may include one or more real-time processors 742 configured to monitor the status of the various sub-systems (e.g., as indicated in status registers 744). The real-time processors 742 may be configured to perform a number of tasks in response to detecting errors. For example, for some errors, the real-time processors 742 may generate an alert in response to detecting an error. As another example, the real-time processors 742 may reset a sub-system to attempt to restore the sub-system to correct operation. The sub-system 740 includes a switch network 748 that may be used to interconnect various sub-systems. For example, the switch network 748 may be configured to connect the various sub-systems 710, 730, and 740 to various interfaces of the I/O sub-system 750. In some applications, the switch network 748 may also be used to isolate the real-time processors 742 from the sub-systems that are to be monitored. Such isolation may be required by certain application standards (e.g., IEC-61508 SIL3 or ISO-26262 standards) to ensure that the real-time processors 742 are not affected by errors that occur in other sub-systems.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A circuit, including:
    a clock monitoring circuit configured and arranged to receive first and second clock signals generated in respective clock domains, the clock monitoring circuit including:
        a first counter configured to count clock cycles of the first clock signal for a first period of time delineated by clock cycles of the second clock signal and output a first count value indicating the number of counted clock cycles; and
        a first threshold comparator circuit configured and arranged to generate an error signal in response to expiration of the first period of time and the first count value output by the first counter falling outside of a first expected range.

2. The circuit of claim 1, wherein:
    the first threshold comparator circuit includes first and second binary comparators, each of the first and second binary comparators having first and second input ports and configured to:
        output a first logic value in response to a first binary number at the first input port being greater than a second binary number at the second input port; and
        output a second logic value in response to the first binary number being less than or equal to the second binary number;
    the first input port of the first binary comparator is coupled to receive the first count value output by the first counter and the second input port of the first binary comparator is coupled to receive a first threshold value defining a maximum value of the first expected range; and
    the first input port of the second binary comparator is coupled to receive a second threshold value defining a minimum value of the first expected range and the second input port of the first binary comparator is coupled to receive the first count value output by the first counter.

3. The circuit of claim 2, wherein the first threshold comparator circuit includes a logical OR gate having a first input port coupled to an output port of the first binary comparator and a second input port connected to an output port of the second binary comparator.

4. The circuit of claim 1, wherein the first and second clock signals are asynchronous.

5. The circuit of claim 1, wherein the clock monitoring circuit includes a set of flip flops configured to sample the output of the first counter at the expiration of the period of time.

6. The circuit of claim 1, further comprising:
    a multiplexer configured to receive a plurality of clock signals; and
    in response to a control signal, provide one of the plurality of clock signals indicated by the control signal to the clock monitoring circuit as the first clock signal.

7. The circuit of claim 1, further comprising:
    a multiplexer configured to receive a plurality of clock signals; and
    in response to a control signal, provide one of the plurality of clock signals indicated by the control signal to the clock monitoring circuit as the second clock signal.

8. The circuit of claim 1, further comprising:
    a first clock circuit configured to generate the first clock signal from a first clock source; and a second clock circuit configured to generate the second clock signal from a second clock source that is different from the first clock source.

9. The circuit of claim 1, wherein the first expected range is specified by a control signal provided to the clock monitoring circuit.

10. The circuit of claim 1, wherein:
the period of time includes a second number of clock cycles of the second clock signal; and
the second number of clock cycles is specified in a first control signal provided to the clock monitoring circuit.

11. The circuit of claim 1, further comprising:
a second counter configured to count clock cycles of the first clock signal for a second period of time defined by the second clock signal and output a second count value indicating the number of clock cycles counted by the second counter, the second period of time being greater than the first period of time; and
a threshold comparator circuit configured and arranged to generate the error signal in response to expiration of the second period of time and the second count value output by the second counter falling outside of a second expected range.

12. The circuit of claim 11, wherein:
the second period of time includes a third number of clock cycles of the second clock signal; and
the third number of clock cycles is specified in a second control signal provided to the clock monitoring circuit.

13. A method for monitoring a first clock signal, comprising:
counting clock cycles of the first clock signal for a first period of time delineated by clock cycles of a second clock signal, wherein the first and second clock signals are derived from different clock sources; and
in response to the counted number of clock cycles falling outside of an expected range, defined by an upper threshold number and a lower threshold number, generating an error signal.

14. The method of claim 13, further comprising determining if the counted number of clock cycles falls outside of the expected range by:
comparing the counted number of clock cycles to the lower threshold number using a first binary comparator;
comparing the counted number of clock cycles to the upper threshold number using a second binary comparator; and
performing a logical OR of an output of the first binary comparator and an output of the second binary comparator to produce the error signal.

15. The method of claim 13, wherein the clock cycles of the first clock signal are counted using a counter circuit, and the first period of time includes a first number of clock cycles of the second clock signal, the method further comprising dividing the second clock signal using a clock divider to produce a third clock signal having one clock cycle for every first number of clock cycles of the second clock signal.

16. The method of claim 15, further comprising in response to a clock edge defining the start of a clock cycle of the third clock signal:
sampling an output of the counter circuit; and
resetting the counter circuit.

17. The method of claim 13, wherein the first and second clock signals are asynchronous.

18. The method of claim 13, wherein the error signal is a higher-accuracy error signal; and
further comprising:
counting clock cycles of the first clock signal for a second period of time delineated by clock cycles of the second clock signal, wherein the second period of time is less than the first period of time; and
in response to the number of clock cycles counted in the second period of time falling outside of an second expected range, defined by a second upper threshold number and a second lower threshold number, generating an lower-accuracy error signal.

19. A method for monitoring a first clock signal, comprising:
selecting a first number of clock cycles;
determining a range of clock cycles expected to be observed in the first clock signal within the period of time;
simulating one or more errors in the first clock signal; and
monitoring the first clock signal for errors by performing operations including:
counting clock cycles of the first clock signal for a period of time defined by the first number of clock cycles in a second clock signal, wherein the first and second clock signals are derived from different clock sources; and
in response to the counted number of clock cycles falling outside of the range, generating an error signal.

20. The method of claim 19, further comprising in response to the error signal not being generated for at least one of the one or more errors simulated in the first clock signal:
increasing the first number of clock cycles; and
repeating the simulating and monitoring steps.

* * * * *